United States Patent
Iizuka et al.

(10) Patent No.: US 9,354,280 B2
(45) Date of Patent: May 31, 2016

(54) CURRENT SENSOR, TABLE TAP WITH CURRENT SENSOR, AND MAGNETIC SUBSTANCE COVER FOR CURRENT SENSOR

(75) Inventors: Koji Iizuka, Shinagawa (JP); Naoyuki Nagao, Shinagawa (JP)

(73) Assignee: FUJITSU COMPONENT LIMITED, Tokyo (JP)

(*) Notice: Subject to any disclaimer, the term of this patent is extended or adjusted under 35 U.S.C. 154(b) by 438 days.

(21) Appl. No.: 13/404,555

(22) Filed: Feb. 24, 2012

(65) Prior Publication Data
US 2012/0217964 A1   Aug. 30, 2012

(30) Foreign Application Priority Data
Feb. 25, 2011   (JP) ................................. 2011-040734

(51) Int. Cl.
| | | |
|---|---|---|
| G01R 15/18 | (2006.01) | |
| G01R 33/00 | (2006.01) | |
| G01R 33/07 | (2006.01) | |
| G01R 15/20 | (2006.01) | |
| H01R 25/00 | (2006.01) | |

(52) U.S. Cl.
CPC .......... *G01R 33/0029* (2013.01); *G01R 15/207* (2013.01); *G01R 33/072* (2013.01); *G01R 15/202* (2013.01); *H01R 25/003* (2013.01)

(58) Field of Classification Search
CPC ...... G01R 33/07; G01R 33/072; G01R 33/09; G01R 33/0011; G01R 15/205
USPC .......... 324/117 H, 117 R, 156–157, 126–127, 324/244, 260, 262
See application file for complete search history.

(56) References Cited

U.S. PATENT DOCUMENTS

| | | | | |
|---|---|---|---|---|
| 5,517,104 A | * | 5/1996 | Kawakami | ........... G01R 15/183 324/117 R |
| 5,831,425 A | * | 11/1998 | Ochiai | ....................... 324/117 R |
| 7,043,543 B2 | * | 5/2006 | Ewing et al. | ................... 709/223 |

(Continued)

FOREIGN PATENT DOCUMENTS

| | | |
|---|---|---|
| JP | 6-16879 | 3/1994 |
| JP | 9-84146 | 3/1997 |

(Continued)

OTHER PUBLICATIONS

Open Loop Hall Effect, http://datasheet.octopart.com/CS-150-F.W.-Bell-datasheet-24344.pdf, Oct. 9, 2009.*

(Continued)

*Primary Examiner* — Patrick Assouad
*Assistant Examiner* — Demetrius Pretlow
(74) *Attorney, Agent, or Firm* — Staas & Halsey LLP

(57) ABSTRACT

A current sensor including: a current bar through which a current flows; a magnetic substance core configured to cover at least a part of the current bar; a magnetic field measurement element that measures a magnetic field generated by the current flowing through the current bar; a substrate to which the magnetic substance core and the magnetic field measurement element are fixed; and a magnetic substance cover that covers the magnetic substance core, and aligns the magnetic substance core by being fixed to the substrate; wherein slits corresponding to a width of the current bar are formed on side surfaces of the magnetic substance cover, and the current bar is aligned with the magnetic substance cover by protruding from the slits.

10 Claims, 8 Drawing Sheets

(56) References Cited

U.S. PATENT DOCUMENTS

| | | | |
|---|---|---|---|
| 7,196,506 B2* | 3/2007 | Catona et al. | 324/117 H |
| 7,615,986 B2* | 11/2009 | Nomoto et al. | 324/117 H |
| 7,709,754 B2* | 5/2010 | Doogue et al. | 174/528 |
| 8,193,803 B2* | 6/2012 | Bose et al. | 324/117 H |
| 2002/0185916 A1* | 12/2002 | Barton et al. | 307/38 |
| 2003/0001559 A1* | 1/2003 | Goto et al. | 324/117 H |
| 2004/0080308 A1* | 4/2004 | Goto | 324/117 H |
| 2005/0156587 A1* | 7/2005 | Yakymyshyn et al. | 324/117 R |
| 2008/0094162 A1* | 4/2008 | Schaerrer | G01R 15/185 336/178 |
| 2009/0009280 A1* | 1/2009 | Ishihara | 336/234 |
| 2009/0039880 A1* | 2/2009 | Nomura | G01R 33/07 324/252 |
| 2009/0115403 A1 | 5/2009 | Bernklau | |
| 2010/0001715 A1* | 1/2010 | Doogue et al. | 324/117 H |
| 2010/0315067 A1* | 12/2010 | Cornelius | G01R 15/207 324/117 H |
| 2011/0006753 A1 | 1/2011 | Yu et al. | |
| 2011/0187348 A1 | 8/2011 | Soneda et al. | |
| 2012/0200291 A1* | 8/2012 | Carpenter et al. | 324/252 |

FOREIGN PATENT DOCUMENTS

| | | |
|---|---|---|
| JP | 11-313441 | 11/1999 |
| JP | 2001-66330 | 3/2001 |
| JP | 2004-152789 | 5/2004 |
| JP | 2006-194650 | 7/2006 |
| JP | 2008-20404 | 1/2008 |
| JP | 2011-17618 | 1/2011 |
| JP | 2011-159464 | 8/2011 |

OTHER PUBLICATIONS

Translation of Japanese Publication No. 2011-17618, Published Jan. 27, 2011 of record.
Translation of Japanese Publication No. 9-84146, Published Mar. 28, 1997 of record.
Translation of Japanese Publication No. 11-313441, Published Nov. 9, 1999 of record.
Translation of Japanese Publication No. 2001-66330, Published Mar. 16, 2001 of record.
Translation of Japanese Publication No. 2011-159464, Published Aug. 18, 2011 of record.
Patent Abstracts of Japan, Publication No. 2011-17618, Published Jan. 27, 2011.
Patent Abstracts of Japan, Publication No. 9-84146, Published Mar. 28, 1997.
Patent Abstracts of Japan, Publication No. 11-313441, Published Nov. 9, 1999.
Patent Abstracts of Japan, Publication No. 2001-66330, Published Mar. 16, 2001.
Patent Abstracts of Japan, Publication No. 2011-159464, Published Aug. 18, 2011.
Patent Abstracts of Japan, Japanese Publication No. 2004-152789, published May 27, 2014.
Patent Abstracts of Japan, Japanese Publication No. 2006-194650, published Jul. 27, 2006.
Patent Abstracts of Japan, Japanese Publication No. 2008-020404, published Jan. 31, 2008.
Japanese Office Action Issued Jun. 3, 2014 in corresponding Japanese Application No. 2011-040734.

* cited by examiner

CURRENT SENSOR, TABLE TAP WITH CURRENT SENSOR, AND MAGNETIC SUBSTANCE COVER FOR CURRENT SENSOR

CROSS-REFERENCE TO RELATED APPLICATION

This application is based upon and claims the benefit of priority of the prior Japanese Patent Application No. 2011-040734, filed on Feb. 25, 2011, the entire contents of which are incorporated herein by reference.

FIELD

A certain aspect of the embodiments discussed herein is related to a current sensor, a table tap with a current sensor, and a magnetic substance cover for a current sensor.

BACKGROUND

There has been known a table tap having a function of distributing a current supplied from a power supply to a plurality of outlets. In addition, there has been known a table tap that includes a current sensor and can measure a current flowing through each outlet. The current sensor includes, for example, a current bar through which a current flows, a magnetic substance core formed around the current bar, and a magnetic field measurement element arranged in a gap of the magnetic substance core (see Japanese Laid-Open Patent Publication No. 2011-017618).

In the conventional current sensor, there is a case where the current bar comes in contact with the magnetic substance core by a shock and this causes danger such as an electric shock.

SUMMARY

According to an aspect of the present invention, there is provided a current sensor including: a current bar through which a current flows; a magnetic substance core configured to cover at least a part of the current bar; a magnetic field measurement element that measures a magnetic field generated by the current flowing through the current bar; a substrate to which the magnetic substance core and the magnetic field measurement element are fixed; and a magnetic substance cover that covers the magnetic substance core, and aligns the magnetic substance core by being fixed to the substrate; wherein slits corresponding to a width of the current bar are formed on side surfaces of the magnetic substance cover, and the current bar is aligned with the magnetic substance cover by protruding from the slits.

The objects and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

A description will now be given of exemplary embodiments with reference to the accompanying drawings.

Figure 1:
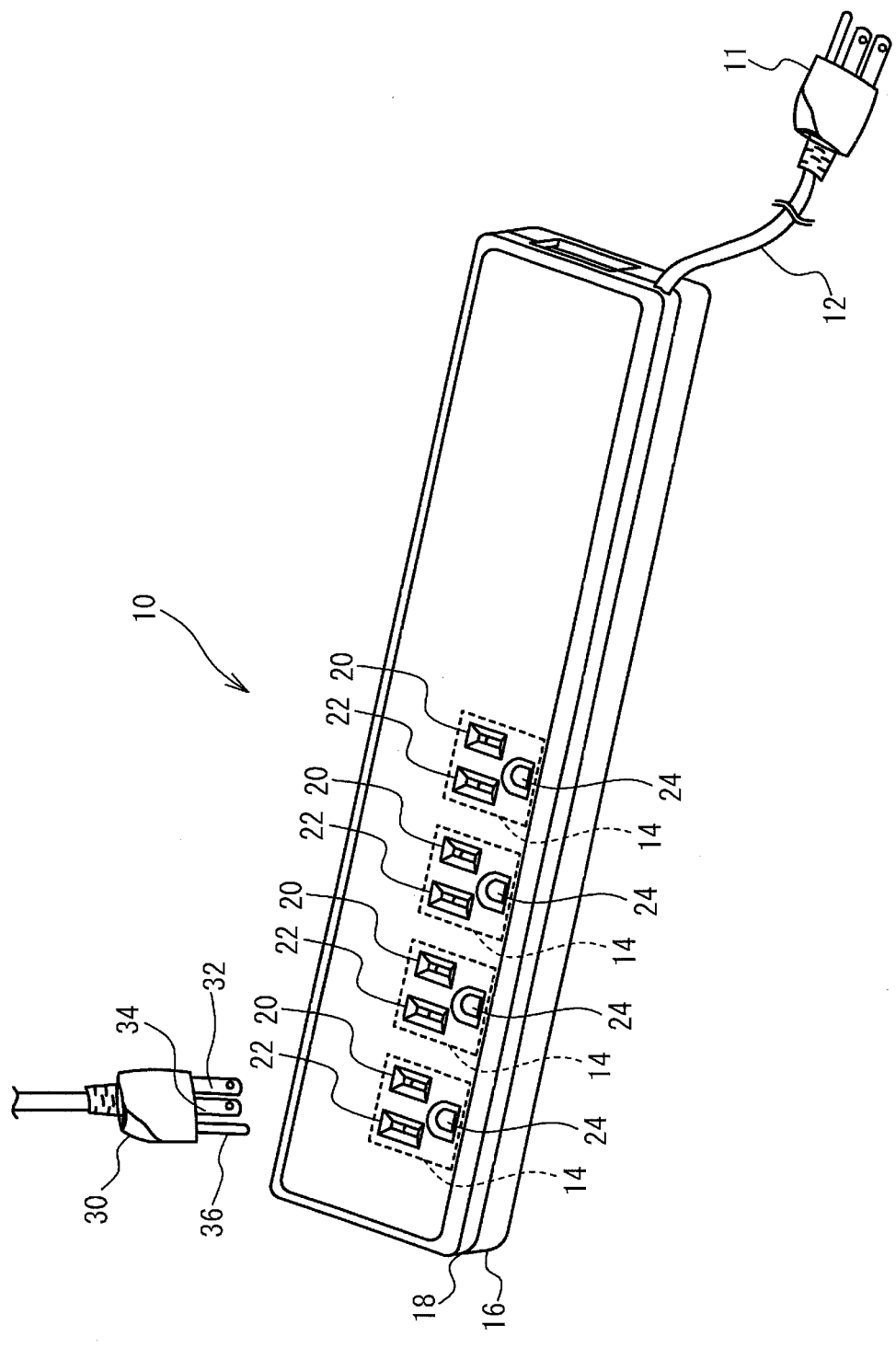
FIG. 1 is a diagram of a table tap according to an embodiment.

FIG. 1 is an appearance diagram of a table tap according to an embodiment. A table tap 10 is used for distributing an alternate current power supply supplied from an outlet plug 11 and a power cord 12, to a plurality of outlets 14. An outlet plug 30 is inserted into each outlet 14. The table tap 10 includes a lower cover 16 and an upper cover 18 which are fixed with each other. These covers are made of insulating resin, for example. These covers can be fixed by screws, for example.

Three openings (a first opening 20, a second opening 22, and a third opening 24) that correspond to each of the outlets 14 and receive the outlet plug 30 with a ground terminal are formed on the upper cover 18. Each of the first opening 20 and the second opening 22 has a plane shape of an approximate rectangle so as to insert a first plug blade 32 and a second plug blade 34 of the outlet plug 30. The third opening 24 has a plane shape of an approximate half circle so as to insert a ground terminal 36 of the outlet plug 30.

Figure 2:
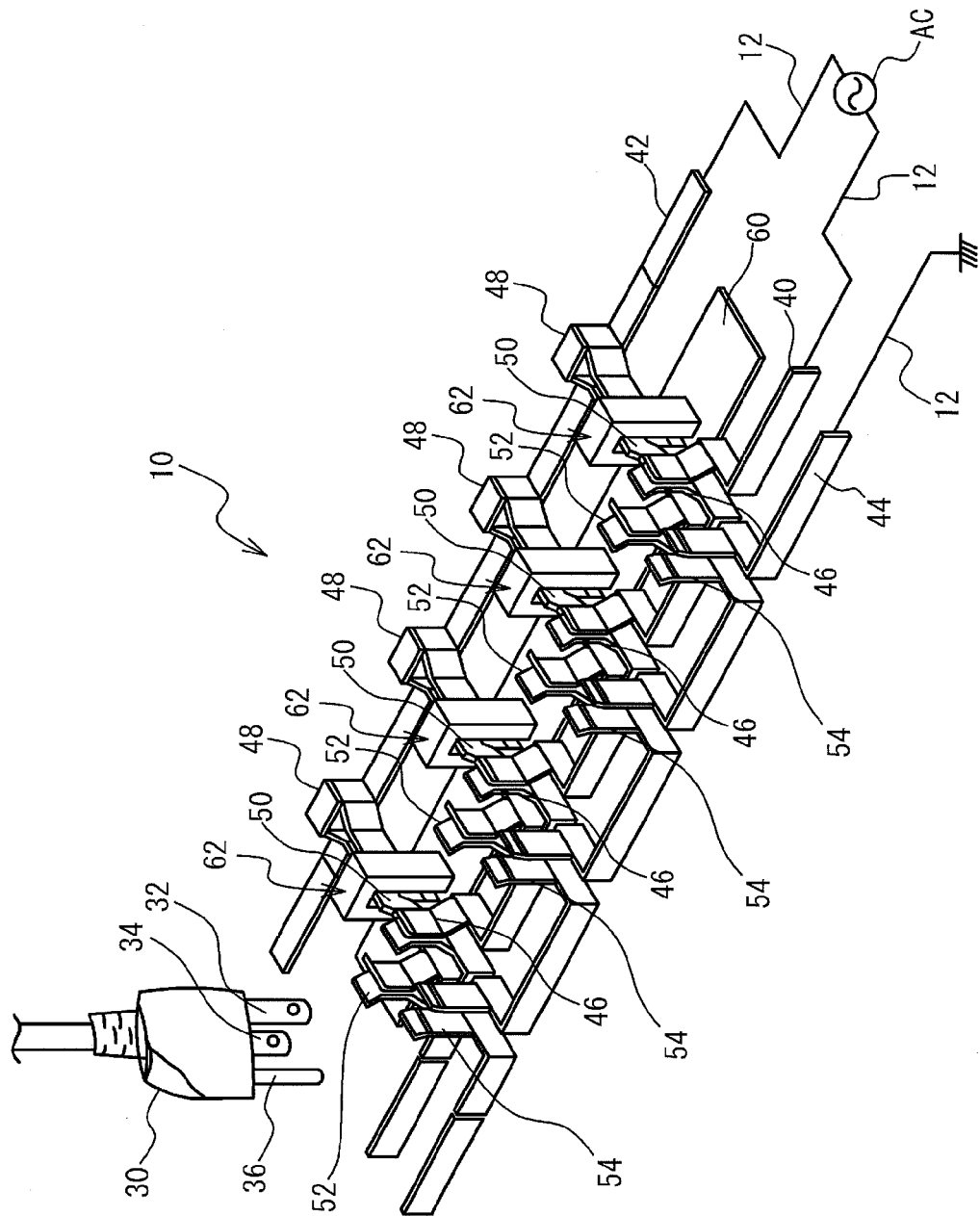
FIG. 2 is a diagram illustrating the internal constitution of the table tap.

FIG. 2 is a diagram of the table tap when the upper cover 18 and the lower cover 16 are removed. The table tap 10 includes a first bus bar 40, a second bus bar 42, and a third bus bar 44. These bus bars can be produced by die-cutting a metal plate such as a brass plate and bending the die-cut metal plate. The first bus bar 40 is connected to a positive electrode of the alternate current power supply AC via the power cord 12. The second bus bar 42 is connected to a negative electrode of the alternate current power supply AC via the power cord 12. The third bus bar 44 is grounded via the power cord 12.

The first bus bar 40 is provided with a plurality of first contacts 46 for receiving the first plug blade 32 of the external outlet plug 30. The second bus bar 42 is provided with a plurality of holding parts 48 arranged at uniform spaces along an extending direction of the second bus bar 42. Each of the holding parts 48 holds each current bar 50 through which a current branched from the second bus bar 42 flows, from both sides of main surfaces of the current bar 50. Each of second contacts 52 is provided on an end of each current bar 50. The second contact 52 receives the second plug blade 34 of the external outlet plug 30, and the second contact 52 and the first contact 46 make a pair. In addition, the third bus bar 44 is provided with a plurality of third contacts 54 for receiving the ground terminal 36 of the outlet plug 30.

A substrate 60 on which a circuit is formed is provided below each current bar 50. Current measurement units 62 for measuring currents flowing through the respective current bars 50 are provided on the substrate 60.

Figure 3:
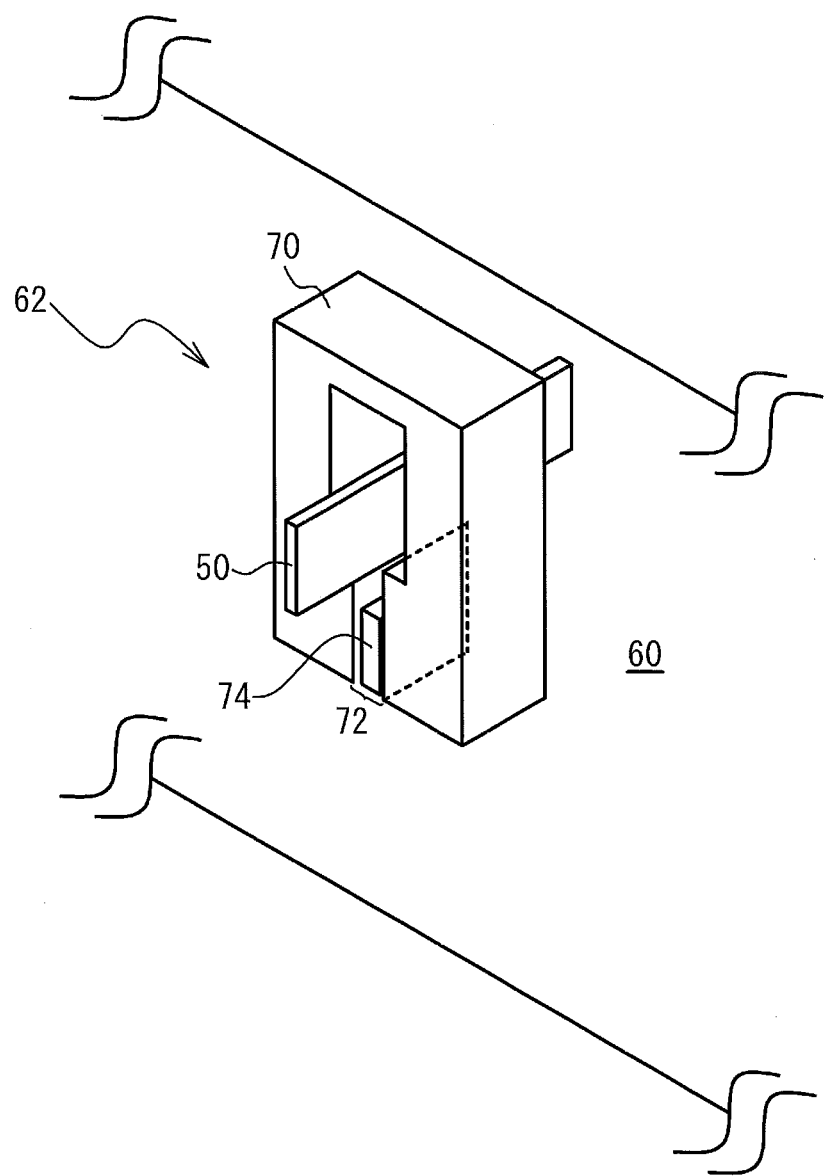
FIG. 3 is a diagram illustrating the constitution of a current sensor.

FIG. 3 is an enlarged diagrammatic perspective view of the current measurement unit 62 and its environment. Each current measurement unit 62 corresponds to each current bar 50, and includes a ferrite 70 fixed on the substrate 60. The ferrite 70 is an example of a magnetic substance core for converging the magnetic field generated by the current flowing through the current bar 50. The ferrite 70 is formed in the shape of an approximate ring so as to surround a portion of the current bar 50. A gap 72 is formed at a lower part of the ferrite 70 (i.e., a side of the substrate 60). A hall element 74 fixed on the substrate 60 is provided in the gap 72. As described later, the actual current measurement unit 62 is equipped with a magnetic substance cover covering the ferrite 70. However, the magnetic substance cover is omitted in FIG. 3.

A measurement principle of the current by the current measurement unit 62 will be described below. First, when the current flows through the current bar 50, a magnetic field is generated around the current bar 50. The magnetic field is converged by the ferrite 70. Then, the intensity of the magnetic field in the gap 72 of the ferrite 70 is measured by the hall element 74. The hall element 74 is an example of a magnetic field measurement element that measures the intensity of the magnetic field. The hall element 74 generates a potential difference ΔV according to the intensity of the magnetic field by being exposed to a magnetic field in a state where a prescribed voltage is given to a power supply terminal. The potential difference ΔV is amplified by an amplifier in the hall element, and then the amplified potential difference ΔV is converted into an analog current signal. The converted analog current signal is output to the outside.

The above-mentioned current signal is digitized by an arithmetic circuit of the substrate 60 connected to the hall element 74, and then the digitized current signal is formatted into any standards (e.g. USB (Universal Serial Bus) standards) and output to an external device (e.g. a computer). According to the constitution described above, the current measurement unit 62 can measure a value of the current flowing through the current bar 50, and calculate power consumption based on the current value. Thereby, the power consumption of each current bar 50 in the table tap 10 can be monitored from the outside.

Here, when the table tap 10 is used, it is desirable to prevent the current bar 50 from coming in contact with the ferrite 70, for prevention of an electric shock. For example, although a method for fixing the corners (the sides) of the ferrite 70 by using an L-shape fixation member is considered, the ferrite 70 cannot be fixed sufficiently by the method. In addition, the current bar 50 is not fixed completely, and can slightly move in a longitudinal direction of the substrate 60. Therefore, relative positional misalignment occurs between the ferrite 70 and the current bar 50, and hence the ferrite 70 and the current bar 50 may contact mutually.

Figure 4:
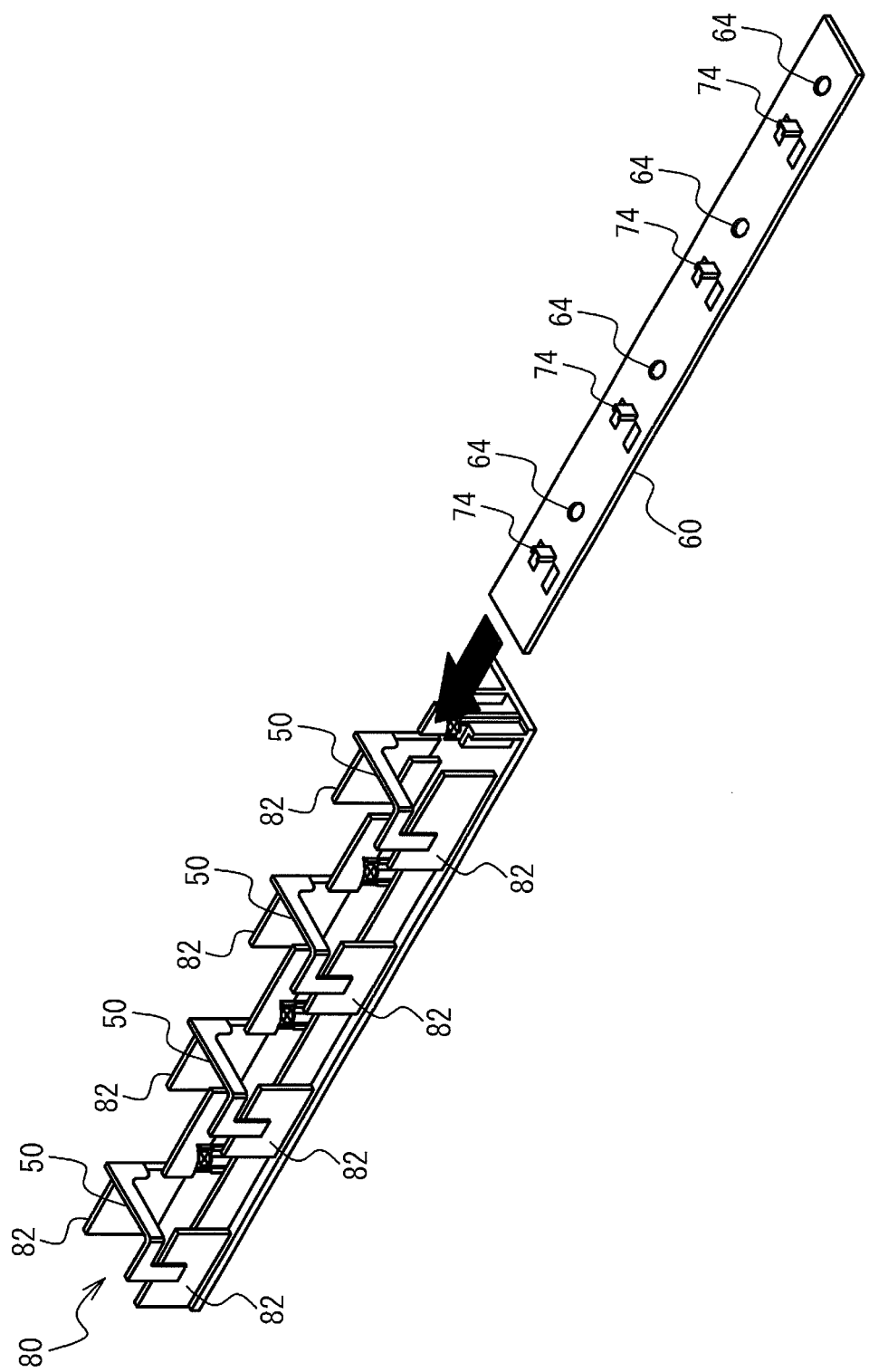
FIG. 4 is a diagram illustrating a method for manufacturing the table tap (step 1)

FIGS. 4 to 7 are diagrams illustrating a method for fixing the ferrite 70 during manufacturing of the table tap 10, and schematically illustrate the constitution of the current bar 50, the ferrite 70 and their environment. A part of the detailed constitution (e.g. the first bus bar 40 to the third bus bar 44 and so on) illustrated in FIG. 2 is omitted. First, the substrate 60 is inserted into a housing 80, as illustrated in FIG. 4, The planar shape of the housing 80 is a rectangle, and the substrate 60 is inserted from a direction of short sides of the housing 80. A plurality of support members 82 are formed along two long sides of the housing 80. The current bar 50 is fixed to two support members 82 arranged on the respective long sides, and is in a floating state from the bottom of the housing 80. The substrate 60 is provided with hall elements 74 connected to the arithmetic circuit in the substrate 60. The hall elements 74 are fixed to the substrate 60 by soldering, for example. In addition, screw holes 64 into which screws are inserted are formed on the substrate 60.

Figure 5:
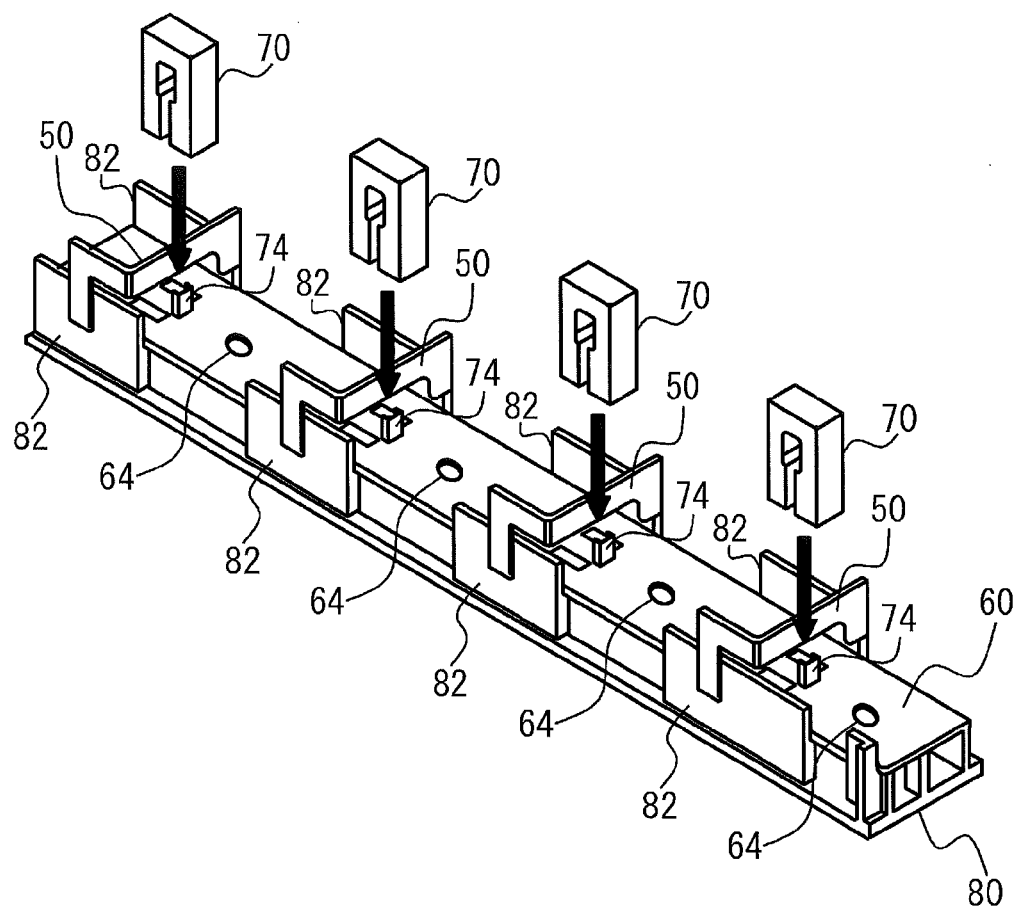
FIG. 5 is a diagram illustrating a method for manufacturing the table tap (step 2)

Next, each ferrite 70 is mounted on the substrate 60 from the upside of each current Bar 50, as illustrated in FIG. 5. At this time, the hall element 74 fixed to the substrate 60 is located directly below the current bar 50 (i.e., between the substrate 60 and the current bar 50). Therefore, the current bar 50 is inserted from the gap 72 of the ferrite 70, then the ferrite 70 is taken down directly, and hence the hall element 74 can be located in the gap 72 of the ferrite 70. In an area where the current bar 50 is located, the width of the gap 72 is formed larger than other portions (i.e., vicinity of the hall element 74). Thereby, the contact between the ferrite 70 and the current bar 50 can be restrained.

Figure 6:
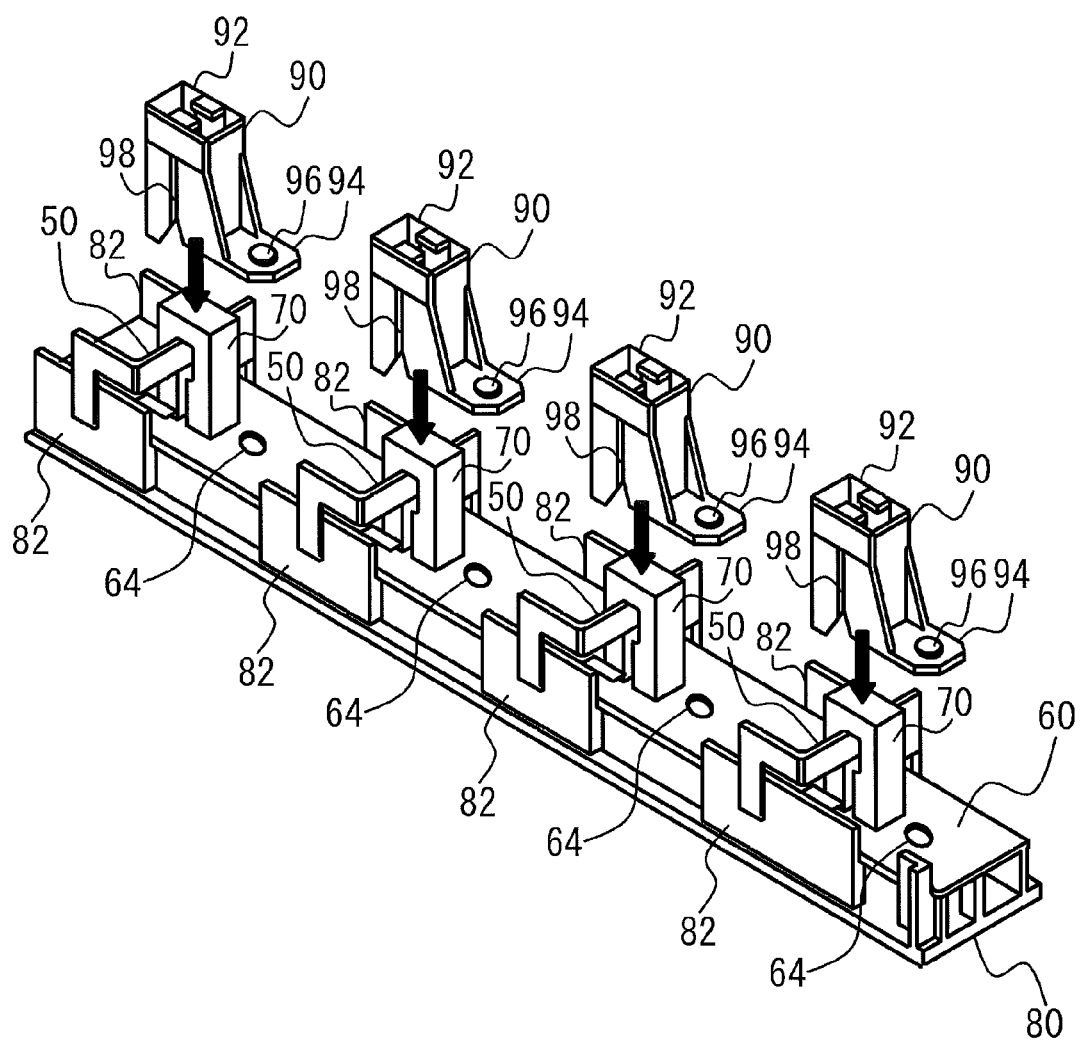
FIG. 6 is a diagram illustrating a method for manufacturing the table tap (step 3)
Figure 7:
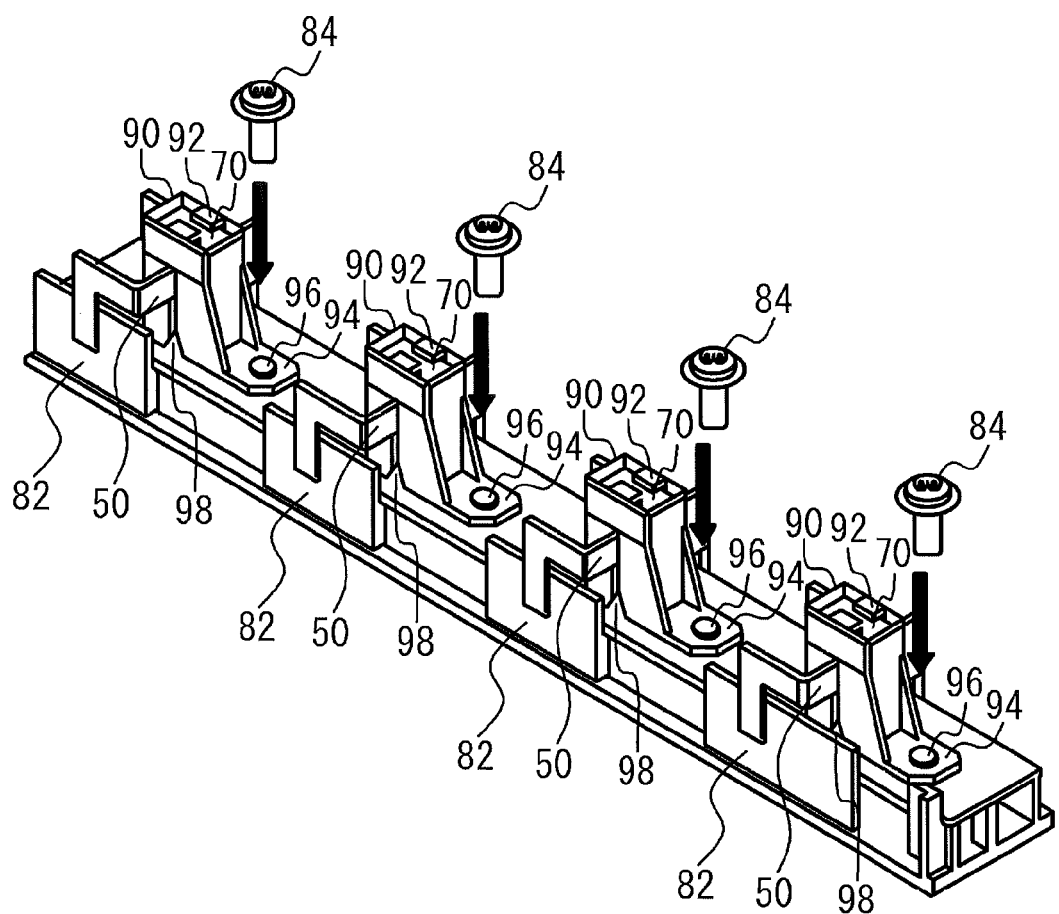
FIG. 7 is a diagram illustrating a method for manufacturing the table tap (step 4)

Next, each ferrite 70 is covered with a ferrite cover 90, as illustrated in FIG. 6. The ferrite cover 90 includes a body unit 92 that covers the ferrite 70, and a fixation unit 94 that fixes the ferrite cover 90 to the substrate 60. The fixation unit 94 extends in the longitudinal direction of the substrate 60 from a lower end of the body unit 92. A through hole 96 of a long hole in which a major axis is set to the longitudinal direction of the substrate 60 is provided on the fixation unit 94. Slits 98 corresponding to the width of the current bar 50 are formed on side surfaces intersecting an extending direction of the current bar 50 among the side surfaces of the body unit 92. It is desirable that the side surfaces including the slits 98 of the ferrite cover 90 intersect an extending direction of the current bar 50 at right angles. An upper surface of the body unit 92 is opened, and claws for holding down the ferrite 70 from above are provided on the upper surface of the body unit 92. Here, the constitution of the upper surface of the body unit 92 is not limited to this, and may be configured to cover a ceiling portion of the body unit 92 perfectly. A polybutylene terephthalate resin can be used as the material of the ferrite cover 90, for example.

When the ferrite 70 is covered with the ferrite cover 90, the slits 98 are aligned with the current bar 50 so that the current bar 50 protrudes from the slits 98. Thereby, a positional relationship between the current bar 50 and the ferrite cover 90 is fixed. Moreover, since the ferrite 70 is covered with the ferrite cover 90, a positional relationship between the ferrite 70 and the ferrite cover 90 is similarly fixed. As a result, a positional relationship between current bar 50 and the ferrite 70 is relatively fixed through the ferrite cover 90.

A screw 84 is inserted into the through hole 96 of the ferrite cover 90 and screwed onto the screw hole 64 of the substrate 60, and hence the ferrite cover 90 is fixed to the substrate 60. Here, a size of a minor axis of the through hole 96 corresponds to that of a diameter of the screw 84, and the major axis of the through hole 96 becomes larger than the diameter of the screw 84. According to this constitution, even when a positional relationship between the through hole 96 and the screw hole 64 has some misalignment, the ferrite cover 90 can be easily screwed onto the substrate 60.

Figure 8A:
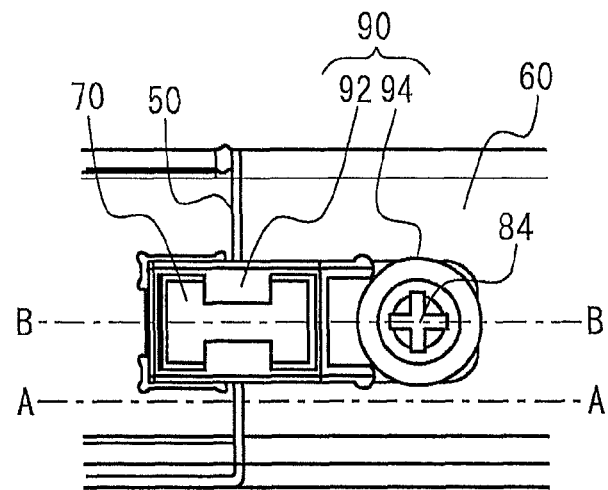
FIGS. 8A to 8C are diagrams illustrating the detailed constitution of the current sensor.
Figure 8B:
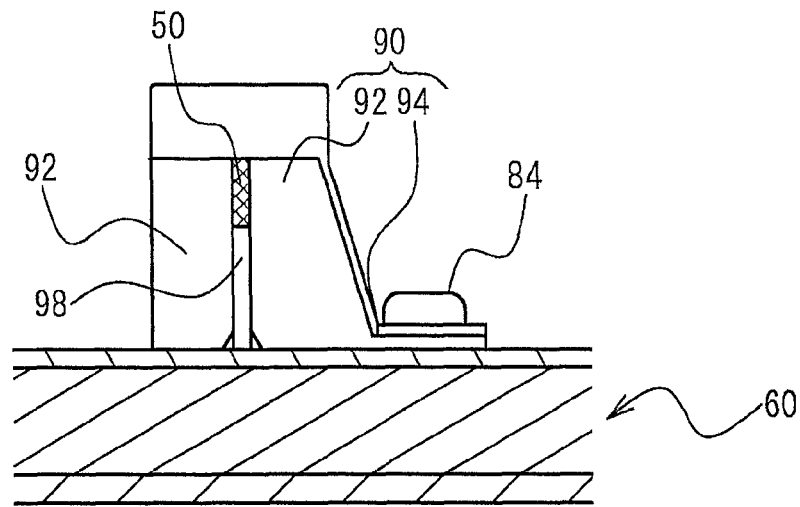
Figure 8C:
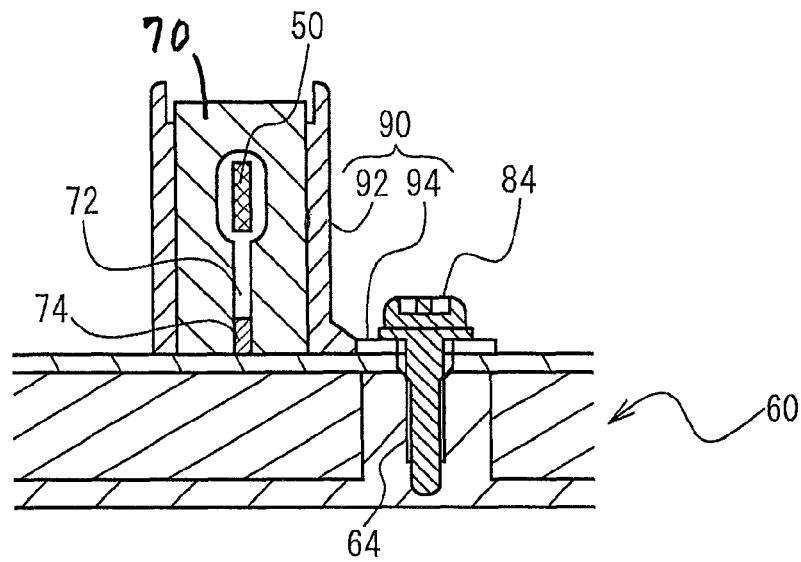

FIGS. 8A to 8C are diagrams illustrating the detailed constitution of the current sensor (i.e., the current measurement unit 62) in a state where the ferrite cover 90 is put on the ferrite 70. FIG. 8A is a plain view of the current sensor, as viewed from above of the ferrite cover 90. FIG. 8B is a sectional view taken along a line A-A in FIG. 8A. FIG. 8C is a sectional view taken along a line B-B in FIG. 8A. The ferrite cover 90 is fixed to the substrate 60 with the screw 84, as illustrated in FIGS. 8A to 8C. The width of the current bar 50 is substantially equal to that of the slit 98, and the ferrite cover 90 is configured so as not to allow the current bar 50 to move, as illustrated in FIG. 8B. As a result, the current bar 50 and the ferrite 70 are fixed by the positional relationship and do not contact each other, as illustrated in FIG. 8C.

According to the table tap of the present embodiment, the positional relationship between the current bar 50 and the ferrite 70 is fixed by using the ferrite cover 90 with the above-mentioned constitution, and hence the contact between the ferrite 70 and the current bar 50 can be avoided. As a result, the electric shock caused by the contact between the ferrite 70 and the current bar 50 can be avoided.

In the present embodiment, the ferrite 70 is aligned by an inner wall of the body unit 92, and the current bar 50 is aligned by the slits 98. The ferrite cover 90 is screwed onto the substrate 60, so that the current bar 50 and the ferrite 70 are indirectly fixed to the substrate 60. Here, although a size of an area formed with the inner wall of the body unit 92 can be made equal to the size of the ferrite 70 (i.e., the inner wall contacts the ferrite 70 at the time of attachment of the ferrite cover 90), a minute clearance (for example, 0.1 mm or less of clearance) may occur between the inner wall and the ferrite 70. Similarly, although the width of the slit 98 can be made equal to the width of the current bar 50, a minute clearance (for example, 0.1 mm or less of clearance) may occur between the slit 98 and the current bar 50. By providing the above-mentioned clearances, a process of covering the ferrite 70 and the current bar 50 with the ferrite cover 90 can be performed more easily.

In the present embodiment, the ferrite 70 is explained as the magnetic substance core for converging the magnetic field generated by the current flowing through the current bar 50. However, material other than the ferrite (e.g. an iron core) can be used as the magnetic substance core. In any case, the magnetic substance core needs to cover at least a part of the current bar 50.

In the present embodiment, the hall element 74 is explained as the magnetic field measurement element that measures the magnetic field. However, a measurement element other than the hall element (e.g. a magnetoresistive sensor) can be used as the magnetic field measurement element. In addition, the position of the hall element 74 is not limited in the gap 72 of the ferrite 70, but the magnetic field can be measured efficiently by arranging the hall device 74 in the gap 72. Moreover, since the hall element 74 is arranged directly below the current bar 50 (i.e., between the substrate 60 and the current bar 50), the alignment of the gap 72 of the ferrite 70 and the hall element 74 can be performed easily. A current transformer can also be used instead of the magnetic substance core. In this case, the magnetic field measurement element is unnecessary.

Although the ferrite cover 90 is fixed to the substrate 60 with the screw 84 in the present embodiment, the ferrite cover 90 may be fixed to the substrate 60 by another method. When the screw 84 is used, it is desirable that the through hole 96 of the ferrite cover 90 is the long hole (specifically, the major axis of the long hole is the longitudinal direction of the substrate 60) so that the alignment in the case of screwing can be easily performed. In the present embodiment, the slits 98 are formed on the opposed side surfaces of the body unit 92 intersecting an extending direction of the current bar 50. Thereby, the current bar 50 can be easily aligned with the ferrite cover 90. However, the slits 98 may be formed on other surfaces other than the opposed side surfaces.

As described above, according to the table tap 10, due to the current sensor (e.g. the current measurement unit 62) and the magnetic substance cover (e.g. the ferrite cover 90), the contact between the current bar and the magnetic substance core can be restrained. In the present embodiment, the table tap equipped with the current measurement unit 62 is explained. However, the present embodiment is applicable to any current sensor in which the magnetic substance core is provided in the vicinity of the current bar.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. A current sensor comprising:
   a current bar through which a current flows;
   a magnetic substance core that covers at least a part of the current bar;
   a magnetic field measurement element that measures a magnetic field generated by the current flowing through the current bar;
   a substrate to which the magnetic substance core and the magnetic field measurement element are fixed; and
   a cover fixed to the substrate to cover the magnetic substance core on the substrate from above, and align the magnetic substance core,
   wherein slits corresponding to a width of the current bar are formed on side surfaces of the cover, the slits align the current bar protruding from the slits, and each slit extends from a position on each side surface of the cover sandwiching the current bar to a lower end of each side surface of the cover, the lower end contacting the substrate, and
   wherein the current bar is spaced from the substrate.

2. The current sensor according to claim 1, wherein a screw hole into which a screw is inserted is formed on the substrate,
   the cover includes a fixation unit that extends in a longitudinal direction of the substrate from a part in contact with the substrate,
   a through hole is formed on the fixation unit, a minor axis of the through hole corresponding to a diameter of the screw, and a major axis of the through hole being larger than a diameter of the screw, and
   the cover is fixed to the substrate by the screw in the screw hole and the through hole.

3. The current sensor according to claim 1, wherein the side surfaces are opposed to each other.

4. The current sensor according to claim 3, wherein the side surfaces intersect an extending direction of the current bar.

5. The current sensor according to claim 1, wherein a clearance between the magnetic substance core and the cover, and a clearance in each slit between the current bar and the magnetic substance cover is 0.1 mm or less.

6. The current sensor according to claim 1, wherein a gap is formed on the magnetic substance core, and the magnetic field measurement element is provided in the gap.

7. The current sensor according to claim 6, wherein the gap is formed between the current bar and the substrate.

8. A table tap comprising:
   a substrate;
   a bus bar electrically connected to a power supply;
   a plurality of outlets that receive a plurality of outlet plugs;
   current bars that are branched from the bus bar, each of the current bars supplying a current of the power supply to each of the outlets; and
   current sensors, each of which measures a current flowing through a corresponding current bar;
   each of the current sensors including:
   a magnetic substance core fixed on the substrate, that covers at least a part of the corresponding current bar;

a magnetic field measurement element fixed on the substrate, that measures a magnetic field generated by the current flowing through the corresponding current bar; and a cover that covers the magnetic substance core, and aligns the magnetic substance core by being fixed to the substrate;

wherein slits corresponding to a width of the corresponding current bar are formed on side surfaces of the cover, and a position of the corresponding current bar is fixed by the slits so that the corresponding current bar does not contact the magnetic substance core, and each slit extends from a position on each side surface of the cover sandwiching the current bar to a lower end of each side surface of the cover, the lower end contacting the substrate, and wherein the current bar is spaced from the substrate.

9. The current sensor according to claim 1, wherein the width of each of the slits is substantially the same as the width of the current bar.

10. A current sensor, comprising:
a current bar through which current flows;
a magnetic substance core that covers at least a part of the current bar and an air gap surrounding the part of the current bar;
a magnetic field measurement element that measures a magnetic field generated by the current flowing through the current bar;
a substrate to which the magnetic substance core and the magnetic field measurement element are fixed; and
a cover fixed to the substrate so as to cover the magnetic substance core on the substrate from above without going into the air gap covered by the magnetic substance core, and align the magnetic substance core,
wherein slits corresponding to a width of the current bar are formed on side surfaces of the cover, and each slit extends from a position on each side surface of the cover sandwiching the current bar to a lower end of each side surface of the cover, the lower end contacting the substrate, and the slits align the current bar protruding from the slits.

* * * * *